INVENTOR.
JACQUES I. PANKOVE
BY
W.S. Hill
AGENT

INVENTOR.
JACQUES I. PANKOVE
BY
W. S. Hill
AGENT

United States Patent Office 3,155,886

Patented Nov. 3, 1964

3,155,886

SOLID STATE SUPERCONDUCTOR TRIODE

Jacques I. Pankove, Princeton, N.J., assignor to Radio Corporation of America, a corporation of Delaware Filed Aug. 16, 1961, Ser. No. 131,892
13 Claims. (Cl. 317—235)

This invention relates to a novel solid state device which operates at temperatures near absolute zero. In particular, the invention relates to a device having at least three terminals which may be used as an active element for amplifying, oscillating, and switching operations in electronic circuits.

Certain materials, referred to herein as superconductors, exhibit two conditions of resistance to the flow of electric current through a body of the material. These conditions are referred to as the normal condition and the superconducting condition. At or above a critical temperature $T_c$, a body of a superconductor is in the normal condition, whereby there is a resistance to the flow of electric current. Below the critical temperature, the body of the superconductor is in the superconducting condition, whereby there is no resistance to the flow of electric current. Bodies of other materials, which are referred to as normal materials, exhibit a normal condition and do not exhibit a superconducting condition.

It is known that a body of a superconductor can be switched from the superconducting condition to the normal condition by applying thereto a sufficiently large magnetic field, or by raising the temperature of the body above its critical temperature $T_c$, or by passing there through a sufficiently large electric current equal to or greater than a current called the critical current. It is also known that certain metal-insulator-metal two-terminal structures at temperatures near absolute zero exhibit a non-linear resistance when one metal is superconducting, and a negative resistance when both metals are superconducting. See, for example, Physical Review Letters, 5, pages 147, 148, and 461 to 466. According to the theory set forth in these references, a superconductor has an energy bandgap for normal charge carriers below a critical temperature $T_c$ near absolute zero. This energy gap increases with decreasing temperature. Electrons having an energy lower than that of the bandgap are coupled to one another and are said to be superconducting electrons. At temperatures near absolute zero, there is also a small population of thermally-generated normal charge carriers (electrons above the energy gap and holes below the energy gap). Such charge carriers are not coupled to one another and can tunnel through a thin electrical insulator which contacts the superconductor. Superconducting carriers cannot tunnel through such an insulator.

It is an object of this invention to provide novel solid state devices which operate at temperatures near absolute zero.

A further object is to provide solid state devices having at least three terminals, which devices may be used in active functions of amplifying, oscillating, or switching in electronic circuits.

The device of the invention comprises a first region (or emitter) of a material selected from the group consisting of superconductors and normal metals, a second region (or base) of a superconductor spaced from the first region by a first thin electrically-insulating layer, and a third region (or collector) of a superconductor spaced from the second region by a second thin electrically-insulating layer. By "thin" is meant that insulating layers have a thickness (distance between regions which are contiguous with the layer) such that normal charge carriers can tunnel therethrough by quantum-mechanical tunneling. The insulating layers may be 6 to 100 A.U. thick, but are preferably 10 to 40 A.U. (Angstrom units) thick. The regions are further related to one another in that the third region (collector) has a larger energy bandgap than the energy bandgap of the second region (base), and the first region (emitter) has a smaller energy bandgap than the second region (base). Where the first region is of a normal metal, the energy bandgap is zero and therefore it satisfies the foregoing relationship.

The devices of the invention are operated at temperatures at which the material of the second region is superconducting. In one mode of operation, a bias voltage $V_t$ is applied to the third region with respect to the second region so that an output current $I_t$ flows through the insulating layer between the second and third regions and in an external load circuit connected to the regions. A control voltage $V_c$ is applied to the first region with respect to the second region. A family of curves may be obtained wherein the output current $I_t$ is a replica of the control voltage $V_c$ and a function of the bias voltage $V_t$. Where the output current $I_t$ passes through a higher impedance than the control current $I_c$ passes through, the device may exhibit a power gain and is useful in amplifying and oscillating circuits.

A more detailed description of several embodiments of the invention is set forth below in conjunction with the drawing in which.

Similar reference numerals are used for similar structures throughout the drawing.

Figure 1:
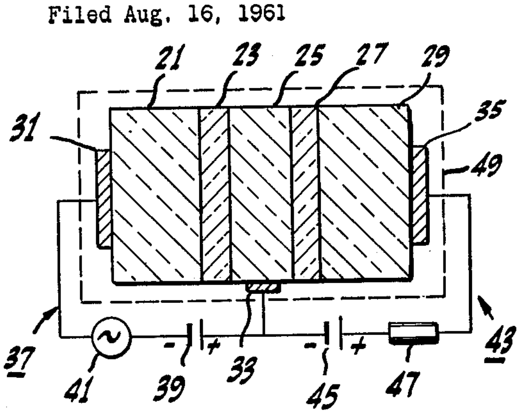
FIGURE 1 is a partially schematic, partially sectional view of a first embodiment of the invention including a superconducting emitter.

A first embodiment of the invention, illustrated in FIGURE 1, comprises a plurality of adjacent layers including a first region or emitter 21, a first thin electrically insulating layer 23, a second region or base 25, a second thin insulating layer 27, and a third region or collector 29. Each of the emitter 21, the base 25, and the collector 29 consists of a superconductor. A superconductor is characterized by exhibiting below a critical temperature $T_c$, an energy bandgap about the Fermi level. This energy bandgap increases with decreasing temperature until it reaches a maximum value $E_{max.}$ at about absolute zero in temperature. Generally, the higher the critical temperature $T_c$, the larger the maximum energy bandgap $E_{max}$. Some suitable superconductors and their calculated maximum energy bandgaps $E_{max.}$ and critical temperature $T_c$ are listed in the table.

The emitter 21, the base 25, and the collector 29 are related to one another in that the collector 29 has a larger energy bandgap than the base 25, and the emitter 21 has a smaller energy bandgap than the base 25. This is a relative consideration so that any of the materials in the table may be selected for any of the regions, provided the inequality relationship of energy gaps with the other regions remains unchanged.

The first and second insulating layers 23 and 27 may be of aluminum oxide such as is produced by oxidation of aluminum metal films; or of silicon dioxide deposited from evaporated material; or of an organic material such as barium stearate, or chromium stearate deposited by adsorption to the surface of one of the regions. The first and second insulating layers 23 and 27 each should be thick enough to block superconducting charge carriers from passage therethrough but thin enough to allow appreciable tunneling of normal charge carriers therethrough. Generally, the insulating layers should be of substantially uniform thickness between 6 and 100 A.U. In the case of aluminum oxide, the insulating layer is preferably 10 to 40 A.U. thick. In the case of barium stearate, the layer is a monomolecular film which is about 40 to 60 A.U. thick.

The emitter region 21 and collect region 29 may be any convenient thickness. The base region 25 should have a thickness between the emitter and collector regions less than a diffusion length for normal charge carriers. Thicknesses between 50 and 200 A.U. have been found convenient.

An emitter connection 31, a base connection 33 and a collector connection 35 is made to the emitter 21, the base 25 and the collector 29 respectively. These connections are low resistance and are non-rectifying.

A first battery 39 and a signal source 41 are connected in series to the emitter connection 31 and the base connection 33 in an input circuit 37. A second battery 45 and a load 47 are connected in series to the collector connection 35 and the base connection 33 in an output circuit 43.

In operation, the device is placed in a cryostat or other means 49 for maintaining the device at temperatures above absolute zero and at temperatures at which the superconductor region with the smallest energy gap is superconducting. The means 49 may comprise for example, an insulating container and cooling means such as a bath of liquid helium and means for evaporating liquid helium in the region adjacent the device. The device is typically operated at or near the boiling point of liquid helium. The means 49 is used also in conjunction with the embodiments of FIGURES 3 to 6.

Figure 2A:
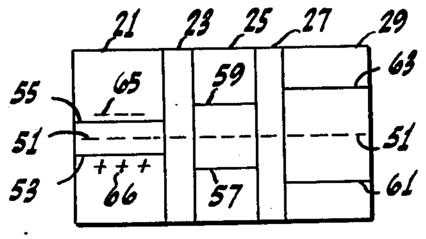
FIGURES 2*a*, 2*b*, and 2*c* are energy diagrams to aid in understanding the operation of the first embodiment.

When the device is at its low operating temperature, all of the regions are superconducting. FIGURE 2*a* illustrates the relationships of the energy gaps in the regions of the device with no signal or bias applied. The Fermi level is shown by a dotted line 51 which extends at the same energy level throughout the device. The emitter 21 exhibits the smallest energy gap between the levels 53 and 55. The base 25 exhibits the intermediate energy gap between the levels 57 and 59, which levels will be used as the reference levels in the description below. The collector 29 exhibits the largest energy gap between the levels 61 and 63.

Because the emitter region 21 has the smallest energy gap, it will also have the largest population of thermally-generated normal carriers as shown by the symbols for electrons 65 in the energy band above the level 55 and by the symbols for holes in the energy band below the level 53.

Figure 2B:
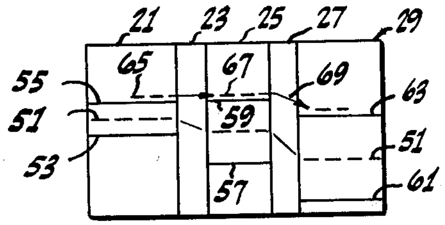

When the collector 29 is biased positively with respect to the base 25, the energy levels 61 and 63 in the collector 29 move downward with respect to the energy regions 57 and 59 in the base 25 as shown in FIGURE 2*b*. The collector 29 is biased so that the level 63 is at or between the levels 57 and 59 of the base 25. If the level 63 is below the level 57, there will be excessive leakage current in the output circuit. If the level 63 is above the level 59, there will be a loss in the collection or extraction efficiency of the collector 29. With the collector 29 biased as shown in FIGURE 2*b*, normal electrons are extracted or collected from the base region 25, which normal electrons may have been thermally-generated in the base 25 or injected from the emitter 21.

The energy levels 53 and 55 in the emitter 21 are raised and lowered by the signal from the source 41. As shown in FIGURE 2*b*, the emitter 21 is negative with respect to the base 25 so that the levels 55 and 53 are raised with respect to the levels 59 and 57 in the base 25. When the levels 53 and 55 are raised, there is an increased flow of normal electrons 65 from the emitter 21 through the first insulating layer 23 into the base 25 as shown by the arrow 67. The flow of electrons 65 increases rapidly as the energy level 55 approaches the energy level 59 in the base 25. Further increases in the height of the energy levels 53 and 55 do not result in further increases in injected normal electron current until the energy level 53 is opposite the energy level 59. The normal electrons injected into the base 25 are extracted therefrom by the biased collector 29 by tunneling through the second insulating layer 27 as shown by the arrow 69 in FIGURE 2*b*. The current $I_t$ through the collector region is a function of the control voltage $V_c$ applied to the emitter 21. Thus, the voltage produced across the load 47 in the load circuit is a replica of the control voltage $V_c$ from the source 41.

As a device, the superconducting triode described above is operated in a manner similar to that of a transistor. A bias across the base and collector regions provides an output current which can be modulated by a current flow between the emitter and base. Power gain results by having a higher impedance in the load circuit 43 than in the control circuit 37. The impedances may be tailored by adjusting the thicknesses of the insulating layers 23 and 27. Power gain also results by having a larger differential in energy bandgap between collector and base than between emitter and base.

Figure 2C:
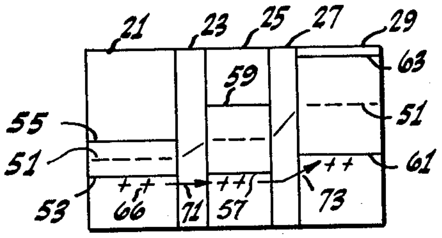

The devices may also be operated in the same manner using holes instead of electrons. This is achieved with the same structure as illustrated in FIGURE 1, but biasing the respective regions in the opposite polarity. As shown in FIGURE 2*c*, the emitter 21 is positive and the collector 29 is negative with respect to the base 25. Holes 66 in the emitter 21 are injected into the base 25 as shown by arrow 71 and extracted therefrom by the collector 29 as shown by arrow 73.

The selection of the relative energy gaps in the emitter, base, and collector of the device is an important feature of the invention. By selecting the superconductor of the collector 29 to have the largest energy gap with respect to the materials of the other regions, the density of normal carriers which contribute to a saturation current in the absence of the injection of normal carriers from the emitter 21 to the base 25, is markedly reduced.

Figure 3:
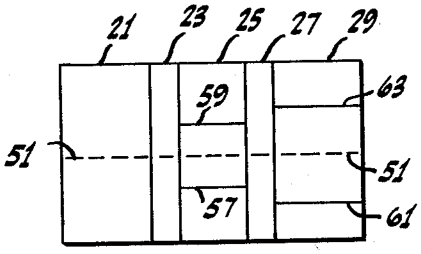
FIGURE 3 is an energy band diagram of a second embodiment of the invention including a normal emitter.

A second embodiment of the invention is illustrated in the energy diagram of FIGURE 3. The structure and operation of the second embodiment is the same as that of the first embodiment, except that the emitter 21 is of a normal material; that is, the emitter 21 is of a material which is not a superconductor. Some suitable metals are gold, silver and copper or aluminum above its critical temperature. In FIGURE 3, the emitter 21 is shown to have no energy gap, but only a Fermi level 51. As in all normal metals, the density of normal electrons decreases exponentially with energy above the Fermi level, and the density of normal holes decreases exponentially with energy below the Fermi level. Therefore, when a signal is applied to the emitter region, the Fermi level in the emitter 21 is raised or lowered with respect to the levels 57 and 59 in the base 25, and more or less normal electrons (or normal holes) are injected into the base 25 in the manner described for the first embodiment.

Figure 4:
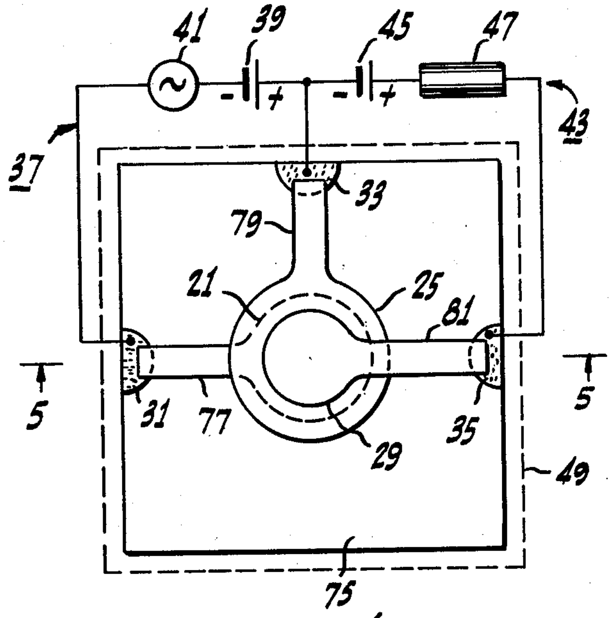
FIGURE 4 is a partially schematic plan view of a third embodiment of the invention including a support for the structure.
Figure 5:
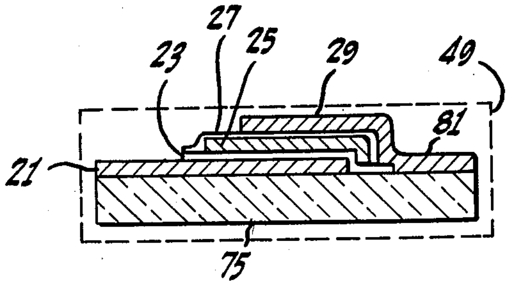
FIGURE 5 is a sectional view of the third embodiment along section lines 5—5 of FIGURE 4.

A third embodiment of the invention is illustrated in the plan view of FIGURE 4 and the sectional view of FIGURE 5. The same reference numerals are used to identify corresponding structures. The third embodiment comprises an electrically-insulating substrate 75, which may be a boro-silicate glass or a quartz glass or a cleaved surface such as that of mica in the form of a square plate. Emitter, base, and collector connections 31, 33 and 35 respectively, of platinum metal adhere to the substrate 75 over a small surface area near the center of three edges of the substrate. Such connections may be prepared by painting or spraying the area with a platinum paint or a platinum resinate, and then heating the substrate 75 and the paint to about 400° C. to volatilize the organic matter and to adhere the platinum.

An emitter 21 of tin metal in the form of a circular film about 0.25 inch in diameter and of arbitrary thickness, say 1000 A.U. thick, is in contact with one surface of the substrate 75 at about the center thereof. An arm 77 of tin metal extends from the circular portion and overlaps the emitter connection 31. The circular portion and the arm may be produced by evaporating tin metal upon a suitably masked portion of the substrate 75.

A first insulating layer 23 of aluminum oxide in the form of a circular film slightly larger than the diameter of the emitter electrode 21 and about 20 A.U. thick rests on and is coaxial with the emitter 21. The first insulating layer 23 may be produced by first evaporating aluminum metal upon a suitably masked portion of the substrate 75 after the emitter electrode 21 is in place to a thickness of about 10 A.U., and then oxidizing the aluminum metal by exposing it to air.

A base 25 of lead metal in the form of a circular film slightly larger than the diameter of the emitter 21 and about 100 A.U. thick rests on the first insulating layer 23 and is coaxial with the emitter electrode 21. An arm 79 extends from the circular portion and overlaps the base connection 33. The circular portion and the arm 79 of the base 25 may be produced in one operation by evaporating lead metal upon a suitably masked portion of the substrate 75.

A second insulating layer 27 of aluminum oxide in the form of a circular film slightly larger than the diameter of the emitter 21 and about 20 A.U. thick rests on and is coaxial with the base 25. The second insulating layer 27 may be formed in the same manner as described for the first insulating layer 23.

A collector 29 of niobium metal in the form of a circular film slightly smaller than the diameter of the emitter 21 and of arbitrary thickness, say 500 A.U. thick, rests on the second insulating layer 27 and is coaxial with the base 25. An arm 81 extends from the circular portion and overlaps the base connection 35. The circular portion and the arm of the collector 29 may be produced in one operation by evaporating niobium metal upon a suitably masked portion of the substrate 75.

In place of aluminum oxide, one or both of the first and second insulating layers 25 and 27 may be of a vapor deposited quartz (silicon dioxide) or a thin layer of barium or chromium stearate adsorbed to the surface of the region immediately below it.

FIGURE 4 shows schematically input and output circuits connected to the device in the same manner as illustrated in FIGURE 1. The device of FIGURE 4 is operated in the same manner as described for the device of FIGURE 1.

Figure 6:
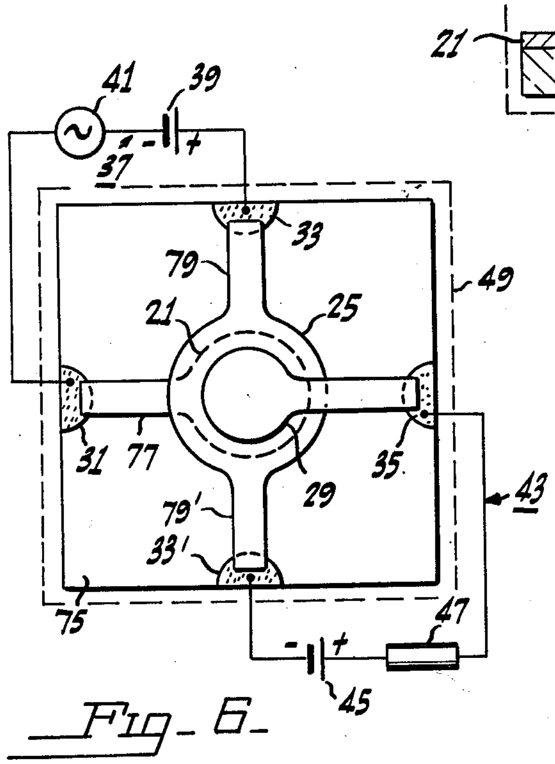
FIGURE 6 is a plan view of a fourth embodiment of the invention somewhat similar to the embodiment of FIGURES 4 and 5 but having the circuit connections differently made.

In some cases it may be desirable to completely eliminate the interference caused by a small contact resistance at the connection 33. This contact resistance being common to both input and output circuits provides undesirable passive coupling between these two circuits. Where this effect is objectionable it can be circumvented by using a second base connection 33' and a second base tab 79' as illustrated in FIGURE 6. This arrangement decouples the contact resistances which otherwise would exist at a common connection such as at 33 of FIGURE 4.

*Table*

| Superconductor | $T_c$, ° K. | $E_{max}$[1] (millivolts) |
|---|---|---|
| Technetium (Tc) | 11.2 | 3.4 |
| Niobium (Nb) | 8.7 | 2.6 |
| Lead (Pb) | 7.2 | 2.7 |
| Lanthanum (La) | 5.4 | 1.6 |
| Vanadium (V) | 4.9 | 1.5 |
| Tantalum (Ta) | 4.4 | 1.3 |
| Mercury (Hg) | 4.2 | 1.3 |
| Tin (Sn) | 3.7 | 1.1 |
| Indium (In) | 3.4 | 1.1 |
| Thallium (Tl) | 2.4 | 0.7 |
| Rhenium (Re) | 1.7 | 0.5 |
| Thorium (Th) | 1.4 | 0.4 |
| Aluminum (Al) | 1.2 | 0.3 |
| Gallium (Ga) | 1.1 | 0.3 |
| Zinc (Zn) | 0.9 | 0.3 |
| Uranium (U) | 0.8 | 0.2 |
| Osmium (Os) | 0.7 | 0.2 |
| Zirconium (Zr) | 0.6 | 0.2 |
| Cadmium (Cd) | 0.6 | 0.2 |
| Ruthenium (Ru) | 0.5 | 0.1 |
| Titanium (Ti) | 0.4 | 0.1 |
| Hafnium (Hf) | 0.4 | 0.1 |

[1] (Energy gap at T=0° K. measured by tunneling in Pb, Sn, In, and Al. For other metals, it is assumed to be 3.5 $kT_c$, where $k$=0.086 millivolt/degree=Boltzmann's constant.)

What is claimed is:

1. An electronic device comprising a first region of a material selected from the group consisting of normal metals and superconductors, a second region of a superconductor spaced from said first region by a first thin electrically-insulating layer, and a third region of a superconductor spaced from said second region by a second thin electrically-insulating layer; said third region having a larger energy bandgap for normal charge carriers than said second region and said first region having a smaller energy bandgap for normal charge carriers than said second region, said first and second electrically-insulating layers each being between 6 and 100 A.U. thick.

2. An electronic device comprising a first region of a material selected from the group consisting of normal metals and superconductors, a second region of a superconductor spaced from said first region by a first thin electrically-insulating layer, and a third region of a superconductor spaced from said second region by a second thin electrically-insulating layer; said third region having a larger energy bandgap for normal charge carriers than said second region and said first region having a smaller energy bandgap for normal charge carriers than said second region, said first and second electrically-insulating layers each being between 6 and 100 A.U. thick, and means for maintaining the temperature of said device below the lowest critical temperature of a superconducting region in said device.

3. An electronic device comprising a first region of a material selected from the group consisting of normal metals and superconductors, a second region of a superconductor spaced from said first region by a first thin electrically-insulating layer, and a third region of a superconductor spaced from said second region by a second thin electrically-insulating layer; said third region having a larger energy bandgap for normal charge carriers than said second region and said first region having a smaller energy bandgap for normal charge carriers than said second region, said first and second electrically-insulating layers each being between 6 and 100 A.U. thick, a connection to said first region, at least two-connections to said second region, and a connection to said third region.

4. An electronic device comprising a first region of a material selected from the group consisting of normal metals and superconductors, a second region of a superconductor spaced from said first region by a first thin electrically-insulating layer, and a third region of a superconductor spaced from said second region by a second thin electrically-insulating layer; said first and second electrically-insulating layers each being between 6 and 100 A.U. thick, said third region having a larger energy bandgap for normal charge carriers than said second region and said first region having a smaller energy bandgap for normal charge carriers than said second region; and a single electrical connection to each of said regions.

5. An electronic device comprising an emitter of a superconductor, a base of a superconductor spaced from said emitter by a first thin electrically-insulating layer, and a collector of a superconductor spaced from said base region by a second thin electrically-insulating layer; said collector having a larger energy bandgap for normal charge carriers than said base and said emitter having a smaller energy bandgap for normal charge carriers than said base, said first and second electrically-insulating layers each being between 6 and 100 A.U. thick.

6. An electronic device comprising an emitter of a normal metal, a base of a superconductor spaced from said emitter by a first thin electrically-insulating layer, and a collector of a superconductor spaced from said base by a second thin electrically-insulating layer; said collector having a larger energy bandgap for normal charge carriers than said base, said first and second electrically-insulating layers each being between 6 and 100 A.U. thick.

7. An electronic device comprising a plurality of adjacent layers including in order a first layer of a material selected from the group consisting of normal metals and superconductors having a relatively small energy bandgap for normal charge carriers, a second layer of an electrically-insulating material, a third layer of a superconductor having an intermediate energy bandgap for normal charge carriers, a fourth layer of an electrically-insulating material, and a fifth layer of a superconductor having relatively large energy bandgap for normal charge carriers, said second and fourth layers each being between 6 and 100 A.U. thick.

8. An electronic device comprising a plurality of adjacent layers including in order a first layer of a material selected from the group consisting of normal metals and superconductors having a relatively small energy band gap for normal charge carriers, a second layer of an electrically-insulating material, a third layer of a superconductor having an intermediate energy bandgap for normal charge carriers, a fourth layer of an electrically-insulating material, and a fifth layer of a superconductor having relatively large energy bandgap for normal charge carriers, said second and fourth layers each being between 6 and 100 A.U. thick, a connection to said first layer, at least two connections to said third layer, and a connection to said fifth layer.

9. An electronic device comprising a plurality of adjacent layers including in order; a first layer of a material selected from the group consisting of normal metals and superconductors having a relatively small energy bandgap for normal charge carriers, a second layer of an electrically-insulating material, a third layer of a superconductor having an intermediate energy bandgap for normal charge carriers, a fourth layer of an electrically-insulating material, and a fifth layer of a superconductor having relatively large energy bandgap for normal charge carriers, said second and fourth layers each being between about 6 and 100 A.U. thick, and means for maintaining the temperature of said device below the critical temperature of said third layer.

10. An electronic device comprising a plurality of adjacent layers including in order: a first layer of a superconductor having a relatively small energy bandgap for normal charge carriers, a second layer of an electrically-insulating material about 6 and 100 A.U. thick, a third layer of a superconductor having an intermediate energy bandgap for normal charge carriers and being between about 50 and 200 A.U. thick, a fourth layer of an electrically-insulating material between about 6 and 100 A.U. thick, and a fifth layer of a superconductor having a relatively large energy bandgap, and means for maintaining the temperature of said device below the critical temperature of said third layer.

11. An electronic device comprising a plurality of adjacent layers including in order: a first layer of a normal metal, a second layer of an electrically-insulating material about 6 to 100 A.U. thick, a third layer of a superconductor having an intermediate energy bandgap for normal charge carriers and being between about 50 and 200 A.U. thick, a fourth layer of an electrically-insulating material between 6 and 100 A.U. thick, and a fifth layer of a superconductor having a relatively large energy bandgap, and means for maintaining the temperature of said device below the critical temperature of said third layer.

12. An electronic device comprising a plurality of adjacent layers including in order a first layer of tin metal, a second layer of aluminum oxide about 10 A.U. thick, a third layer of lead metal about 100 A.U. thick, a fourth layer of aluminum oxide about 20 A.U. thick, and a fifth layer of niobium metal.

13. A electronic device comprising a plurality of adjacent layers including in order a first layer of aluminum metal, a second layer of aluminum oxide about 10 A.U. thick, a third layer of tin about 100 A.U. thick, a fourth layer comprising a monomolecular film of barium stearate, and a fifth layer of lead metal.

References Cited in the file of this patent

UNITED STATES PATENTS

| | | |
|---|---|---|
| 3,056,073 | Mead | Sept. 25, 1962 |
| 3,056,889 | Nyberg | Oct. 2, 1962 |
| 3,116,427 | Giaever | Dec. 31, 1963 |

OTHER REFERENCES

"Electronics Newsletter," Electronics, vol. 33, No. 48, November 25, 1960, page 11, first four paragraphs entitled, "Tunneling Observed in Supercooled Thinfilms."

Nicol et al.: "Direct Measurement of the Superconducting Energy Gap," Phys. Rev. Lett., vol. 5, pp. 461–464, November 15, 1960.

Bremer: "Cryogenic Devices," Electrical Manufacturing, February 1958, page 79.

Giaever: "Electron Tunneling Between Two Superconductors," Phys. Rev. Lett., vol. 5, pp. 464–466, November 15, 1960.